United States Patent
Brandes et al.

(10) Patent No.: US 6,445,006 B1
(45) Date of Patent: Sep. 3, 2002

(54) MICROELECTRONIC AND MICROELECTROMECHANICAL DEVICES COMPRISING CARBON NANOTUBE COMPONENTS, AND METHODS OF MAKING SAME

(75) Inventors: George R. Brandes, Southbury; Xueping Xu, Stamford, both of CT (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 09/361,910

(22) Filed: Jul. 27, 1999

Related U.S. Application Data

(63) Continuation-in-part of application No. 09/191,269, filed on Nov. 12, 1998, now Pat. No. 5,973,444, which is a continuation of application No. 08/575,485, filed on Dec. 20, 1995, now Pat. No. 5,872,442.

(51) Int. Cl.[7] .............................................. H01L 21/365

(52) U.S. Cl. .............................. 257/76; 438/99; 257/24; 324/419

(58) Field of Search ........................... 445/24; 438/105, 438/99; 257/76, 24; 324/419

(56) References Cited

U.S. PATENT DOCUMENTS

| | | | |
|---|---|---|---|
| 4,041,346 A | 8/1977 | Bursey et al. | 313/336 |
| 4,272,699 A | 6/1981 | Faubel et al. | 313/360 |
| 4,301,369 A | 11/1981 | Matsuo et al. | 250/423 |
| 5,395,774 A | 3/1995 | Bajor et al. | 437/31 |
| 5,583,393 A | 12/1996 | Jones | 313/495 |
| 5,726,524 A | 3/1998 | Debe | 313/309 |
| 5,773,921 A | 6/1998 | Keesman et al. | 313/309 |
| 5,872,422 A | 2/1999 | Xu et al. | 313/346 R |

OTHER PUBLICATIONS

Terrones et al, "Controlled production of aligned–nanotube bundles ", *Nature*, vol. 388, pp 52–55, Jul. 1997.

Lee et al, "Conductivity enhancement in single–walled carbon nanotube bundles doped with K and Br", *Nature*, vol. 388, 255–257, Jul. 1997.

McEuen, "Nanotechnology: Carbon–based electronics" *Nature*, vol. 393, pp 15–17, May 1998.

Kong et al, "Chemical vapor deposition of methane for single–walled carbon nanotubes", Chemical Physics Letters, vol. 292, p. 567–574, Aug. 1998.

Martel et al, "Single– and and multi–wall carbon nanotube field–effect transistors", Applied Physics Letters, vol. 73, pp 2447–2449, Oct. 1998.

Kong et al, "Synthesis of individual single–walled carbon nanotubes on patterned silicon wafers", *Nature*, vol. 395, pp 878–881 Oct. 1998.

Ren et al, "Synthesis of Large Arrays of Well–Aligned Carbon Nanotubes on Glass" *Science*, vol. 282, pp 1105–1107 Nov. 1998.

Esfarjani et al, "Electronic and transport properties of N–P doped nanotubes", Applied Physics Letters, vol. 74, pp 79–81, Jan. 1999.

Braughman et al, "Carbon nanotube Actuators" Science, vol. 284, No. 5418, pp 1340–1344 May 1999.

Farajian et al, "Nonlinear Coherent Transport through Doped Nanotube Junctions" Physics Review Letters, vol. 82, p. 5084 Jun. 1999.

(List continued on next page.)

*Primary Examiner*—Kenneth J. Ramsey
(74) *Attorney, Agent, or Firm*—Oliver A. Zitzmann; Steven J. Hultquist; Margaret Chappuis

(57) ABSTRACT

A microelectronic or microelectromechanical device, including a substrate and a carbon microfiber formed thereon, which may be employed as an electrical connector for the device or as a selectively translational component of a microelectromechanical (MEMS) device.

55 Claims, 9 Drawing Sheets

OTHER PUBLICATIONS

Anchal Srivastava, et al., "Effect of External Electric Field on the Growth of Nanotubes", Applied Physics Letters, vol. 72, No. 14, Apr. 6, 1998, pp. 1685–1687.

Bingqing Wei et al., "Electrical Transport in Pure and Boron–Doped Carbon Nanotubes", Applied Physics Letters, vol. 74, No. 21, May 24, 1999, pp. 3149–3151.

Keivan Esfarjani, et al., "Electronic and Transport Properties of N–P Doped Nanotubes", Applied Physics Letters, vol. 74, No. 1, Jan. 4, 1999, pp. 79–81.

N.M. Rodriguez, "A Review of Catalytically Grown Carbon Nanofibers", *J. Mater. Res.*, 1993, vol. 8, pp. 3233–3250.

Walt A. de Heer, A. Chatelain, D. Ugarte, "A Carbon Nanotube Field–Emission Electron Source", *Science,* 1995, vol. 270, pp. 1179–1180.

L.A. Chernozatonskii, et al., "Electron Field Emission from Nanofilament Carbon Films", *Chemical Physics Letters*, 1995, vol. 233, pp. 63–68.

Walt A. de Heer, et al., "Aligned Carbon Nanotube Films: Production and Optical and Electronics Properties", *Science,* 1995, vol. 268, pp. 845–847.

Philippe Poncharal et al., "Electrostatic Deflections and Electromechanical Resonances of Carbon Nanotubes", Science, vol. 283, Mar. 5, 1999, pp. 1513–1516.

B. H. Fishbine, "Carbon Nanotube Alignment and Manipulation Using Electrostatic Fields", Fullerene Science and Technology, 4(1), 87–100 (1996), pp. 87–100.

Sander J. Tans et al., "Room Temperature Transistor based on a Single Nanotube", Nature, vol. 393, May 7, 1998, pp. 49–52.

Phillip G. Collins, "Nanotube Nanodevice", Science, vol. 278, Oct. 3, 1997, pp. 100–103.

MICROELECTRONIC AND MICROELECTROMECHANICAL DEVICES COMPRISING CARBON NANOTUBE COMPONENTS, AND METHODS OF MAKING SAME

CROSS-REFERENCE TO RELATED APPLICATIONS

This is a continuation in part of U.S. patent application Ser. No. 09/191,269 filed Nov. 12, 1998, now U.S. Pat. No. 5,973,444, the names of Xueping Xu, Charles P. Beetz, George R. Brandes, Robert W. Boerstler and John W. Steinbeck, which in turn is a continuation of U.S. patent application Ser. No. 08/575,485 filed Dec. 20, 1995 in the names of Xueping Xu, Charles P. Beetz, George R. Brandes, Robert W. Boerstler and John W. Steinbeck, and issued Feb. 16, 1999 as U.S. Pat. No. 5,872,442 for "Carbon Fiber-Based Field Emission Devices."

GOVERNMENT RIGHTS IN INVENTION

This invention was made with Government support under Contract No. N00014-96-C-0266 awarded by the Office of Naval Research. The Government has certain rights in this invention.

BACKGROUND OF THE INVENTION

1. Field of the Invention

This invention relates to microelectronic and microelectromechanical devices comprising carbon nanotube components, and to methods for making same.

2. Description of the Related Art

U.S. Pat. No. 5,872,422 issued Feb. 16, 1999 for "Carbon Fiber-Based Field Emission Devices" discloses cold cathodes for use in electronic devices and displays and methods of making and using cold cathode devices. Cold cathodes are provided comprising a surface havingcatalytically grown carbon-containing fibers as robust electron emission sources. As described in U.S. Pat. No. 5,872,422, field emission cathodes are fabricated by selectively depositing a catalyst film on the desired area of a substrate surface, followed by catalytic growth of the carbon-containing fiber emitter structures. Field emission displays are constructed using the carbon-containing fiber-based cold cathodes. U.S. Pat. No. 5,872,422 also describes precursor substrates suitable forcatalytically growing electron emitter structures, as well as methods of producing other devices, e.g., cold cathode vacuum fluorescent displays, and components for such devices by catalytic growth of carbon-containing fiber structures.

The present invention extends the technology of U.S. Pat. No. 5,872,422 to microelectronic and microelectromechanical structures based on carbon nanotubes.

SUMMARY OF THE INVENTION

The present invention in one aspect relates to a microelectronic or microelectromechanical device, comprising a substrate and a fiber formed of a carbon-containing material on the substrate. Such fiber may for example electrically interconnect two or more non-insulative regions on the substrate. Alternatively, the fiber may have a free end that istranslationally mobile in the device. The fiber may be doped, e.g., to constitutepn junctions or other device structure, and the fiber may be bonded by spot welding to provide structural integrity to the interface of the fiber and an associated element or surface to which the fiber is joined. Such dopants may be any suitable species e.g., the dopant impurities may comprise H, B, Al, N, P, Li, Be, Na, or K.

In another aspect, the invention relates to an external stimulus-mediated wiring system comprising carbon microfiber connectors in a microelectronic or microelectromechanical device structure.

A further aspect of the invention relates to a method of forming a carbon-containing fiber on a substrate, comprising growing at least one carbon-containing fibercatalytically on a surface of the substrate by heating the substrate in the presence of a carbon source to a temperature sufficient to grow the fiber on the substrate surface, as a component of a microelectronic or microelectromechanical device.

Another aspect of the invention relates to a method of forming a wiring system comprising carbon microfiber connectors in a microelectronic or microelectromechanical device structure, including the steps of: providing an external stimulus-mediated growth circuit comprising a multiplicity of imaging inputs and input-responsive growth means including a substrate having carbon microfiber growth catalyst thereon, exposing the imaging inputs to stimulation images, responsively generating microfiber growth output signals from the imaging inputs, and generating carbon microfiber growth on the substrate in the presence of a carbon source, at loci of the substrate determined by the generated microfiber growth output signals.

Other aspects, features and embodiments of the invention will be more fully apparent from the ensuing disclosure and appended claims.

As used herein, the terms "carbon containing microfibers" and "carbon nanotubes" are used interchangeably. The carbon nanotubes may comprise only a single graphite layer (single-walled nanotubes), or alternatively may include multiple graphite layers (multi-walled nanotubes). A carbon containing microfiber structure may comprise one carbon nanotube or a bundle of many carbon nanotubes. The nanotube may be without defects, or it may contain various degrees of structural defects, impurities or metallic particles atan extremity (tip) or other portions thereof

DETAILED DESCRIPTION OF THE INVENTION, AND PREFERRED EMBODIMENTS THEREOF

Figure 1A:
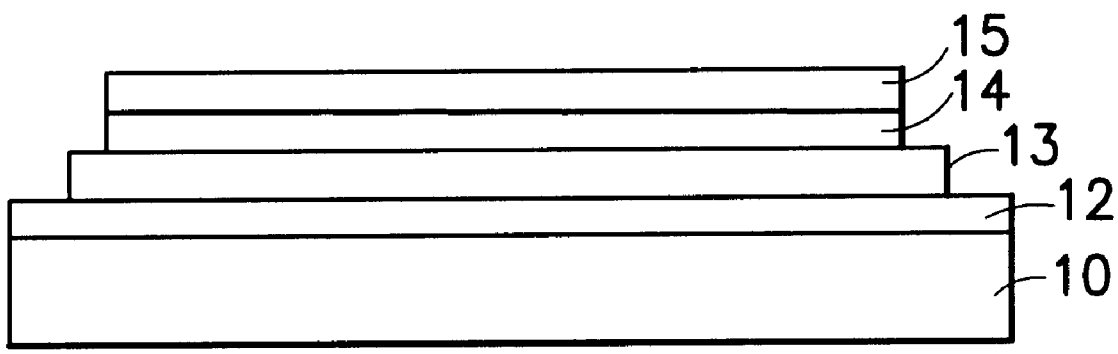
FIGS. 1A and 1B illustrate a procedure for producing carbonnanotube structures on a substrate according to one embodiment of the invention.

The disclosures of U.S. patent application Ser. No. 09/191,269 filed Nov. 12, 1998 in the names of Xueping Xu, Charles P. Beetz, George R. Brandes, Robert W. Boerstler and John W. Steinbeck for "Carbon Fiber-Based Field Emission Devices," and U.S. patent application Ser. No. 08/575,485 filed Dec. 20, 1995 in the names of Xueping Xu, Charles P. Beetz, George R. Brandes, Robert W. Boerstler and John W. Steinbeck, for "Carbon Fiber-Based Field Emission Devices," issued Feb. 16, 1999 as U.S. Pat. No. 5,872,442, are hereby incorporated herein by reference in their entirety.

The active element(s) in the illustrative embodiments of the invention described hereinafter comprise(s) carbon microfiber(s), more commonly referred to as carbon nanotube(s). Such carbon nanotube(s) may suitably be grown catalytically using the process and techniques described more fully in the aforementioned U.S. Pat. No. 5,872,422.

The catalytic growth process of U.S. Pat. No. 5,872,422 involves growing at least one carboncontaining fiber catalytically on a growth surface of a substrate by heating the substrate in the presence of a carbon source to a temperature sufficient to grow the fiber on the growth surface. The heating may for example be carried out at a temperature from about 350° C. to about 1200° C. in a carbon-containing gas. The carbon-containing gas may for example comprise hydrocarbons, carbon-containing compounds and/or carbon monoxide.

The growth process may advantageously employ a catalyst including at least one transition metal, e.g., one or more transition metal species, such as Fe, Co, Ni, Mn, Cr, Mo, W, Re, Ru, Os, Rh, Ir, Pd, Pt, Cu and/or Zn. The catalyst may for example incorporate a compound comprising at least one such transition metal, e.g., $Fe_2O_3$. The catalyst may be in any suitable form, such as catalyst particles, e.g., having an average diameter less than about 200 nanometers. Alternatively, the catalyst may be in the form of a catalyst film, e.g., having a thickness less than about 1 micron.

The growth of the carbon-containing microfiber element (s) may be carried out in any suitable manner, as for example including the steps of: forming a catalyst film onto the growth surface; forming a patterned dielectric film onto the catalyst film; forming a patterned gate metal film onto and corresponding to the patterned dielectric film; and heating the substrate in the presence of a carbon source to the temperature sufficient to grow the carbon-cntaining microfiber structure on the exposed portions of the growth surface. The carbon-containingmicrofiber structure may have an average diameter less than 10 microns, and an average length to width ratio greater than about 2.

In the microelectronic or microelectromechanical device of the invention, the carbon-containing fiber may be employed to electrically interconnect two or more non-insulative regions on the substrate. Alternatively, the fiber may have a free end that istranslationally mobile in the device.

One illustrative procedure for producing carbon nanotubes is more fully shown and described with reference to FIGS. 1A and 1B herein.

Figure 1B:
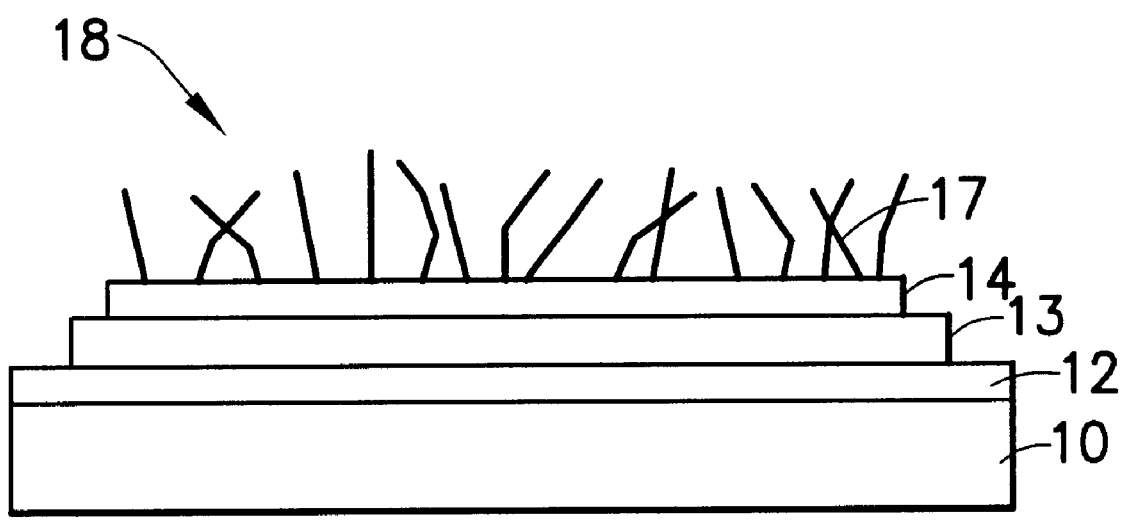

As illustrated in FIG. 1A, a substrate 10 with additional, possibly patterned electronic device layers 12, 13 constitutes the starting structure. It will be appreciated that additional electronic device layers 12, 13 are optional layers and that substrate 10 may constitute the starting device structure. Alternatively, many more device layers than shown may be employed. Thus, the substrate and the optional device layers together are comprised as a starting device structure on which the carbon nanotube elements may be grown.

To effect such growth of carbon nanotube elements, a catalyst support layer 14 and a catalyst layer 15 are deposited or patterned using any of the procedures known to those skilled in the art. The catalyst support may be of any suitable material, as for example amorphous silicon carbide, and such support layer may for example be on the order of 10–100 nanometers (nm) in thickness. The catalyst layer 15 may for example comprise iron film or other suitable catalyst material at an appropriate thickness, e.g., of 1–10 nm thickness.

After its fabrication, the resultant structure shown in FIG. 1A is heated to about 700° C. degrees in an environment 18 (see FIG. 1B) comprising a carbon microfiber source gas, e.g., a hydrocarbon gas such as acetylene being usefully employed for such purpose. Catalyst type, catalyst thickness, and growth conditions may be adjusted to produce carbon nanotubes of desired length, density, crystalline quality and diameter, as more fully described in the aforementioned U.S. Pat. No. 5,872,422. The catalyst is at least partially consumed in the growth process.

Any suitable growth conditions may be usefully employed that are efficacious to form the desired carbon nanotubes. Modifications of the growth conditions may be employed as desired. For example, the growth may take place in the presence of an electric or magnetic field to control the growth of the carbon microfibers. As a further variation, the carbon microfibers may be grown in an atmosphere that contains a dopant or other material, to modify electrical conductivity of the carbon microfibers. In a still further embodiment, the carbon microfiber after its growth may be exposed (such as by gas or liquid contacting, or by implantation in the microfiber) to species that will alter its conductivity or create an insulating layer at the surface of the microfiber.

Catalytically grown carbon nanotubes thus grown in accordance with the invention may be used as conductors and components in microelectronic devices and as components in microelectromechanical devices. These respective applications are discussed in turn below.

Conductors

In electrically connecting elements or regions of microelectronic devices, a metal film is typically deposited using a mask, or if the scale/currents are larger, soldering or wedge/ball bonding is employed. The carbon nanotube technique described hereinafter provides an alternative method of electrically contacting two elements or regions, with the advantages that:

(1) The smooth surface needed for thin film wire contacts is not required and in fact, multiple device layers may be electrically connected with this technique, facilitating three dimensional structures.

(2) Tools beyond those used for conventional patterning are not required.

(3) Large numbers of contacts may be made in parallel.

(4) The wiring pattern need not be determined in advance, nor need it be determined precisely (it may be determined by stimulae to the device).

Figure 2A:
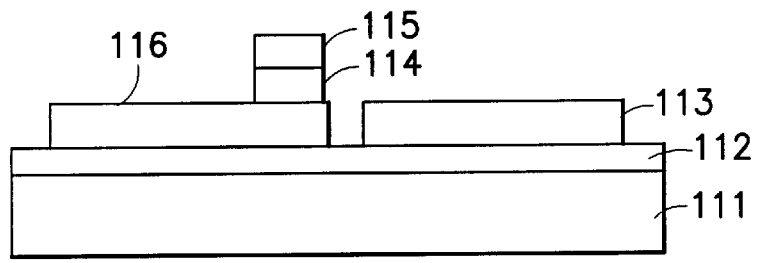
FIGS. 2A–2D depict a process flow for electrically connecting non-insulating objects on a substrate by a carbon microfiber connector.
Figure 2B:
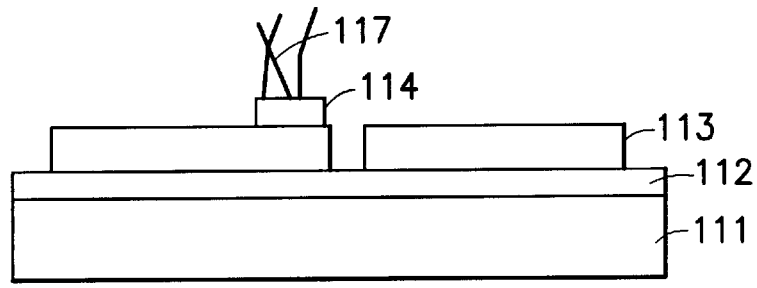
Figure 2C:
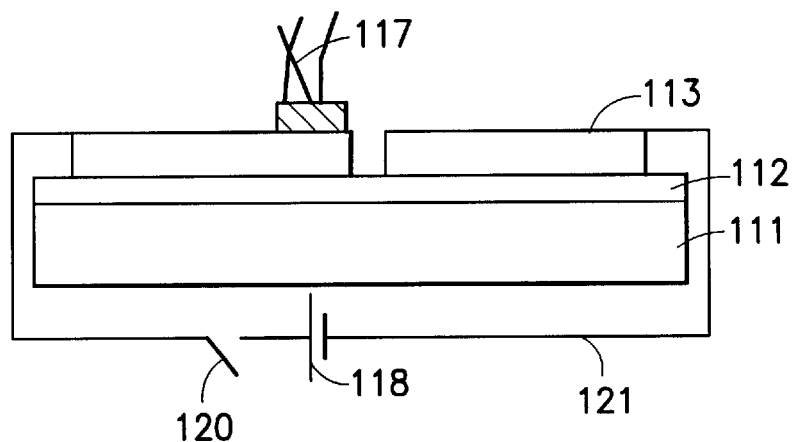

FIGS. 2A–2D show the basic steps for producing wires that electrically connect device elements or regions. Objects 113 and 116 in FIGS. 2A–2D represent two electrically non-insulating objects (e.g. metal or semiconductor) that are to be connected, on the substrate 111 and optional device layer(s) 112. Catalyst support 114 and catalyst 115 are deposited on object 116 (FIG. 2A). Some or all of object 116 may be covered by the catalyst support and catalyst, with the specific dimensions and location being determined by the product device and the regions to be connected. The carbon microfibers 117 are grown using appropriate growth conditions.

Figure 2D:
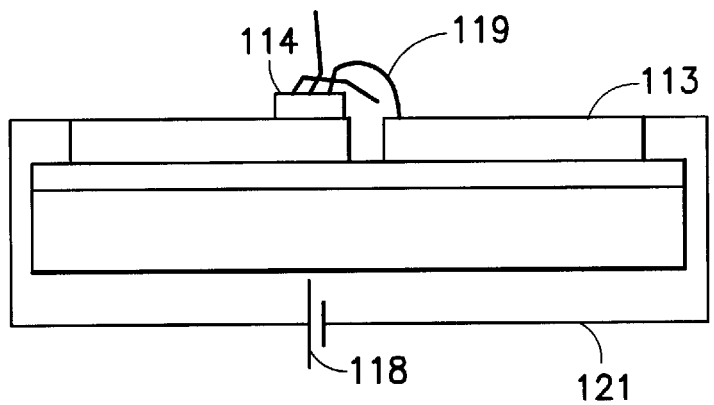

An electric field-generating circuit comprising power source 118 and line 121, which may be part of the substrate structure or separate from it, is operated to impose an electric field on the carbon microfibers. The electric field is typically<100 V$\mu$m$^{-1}$, with the specific magnitude being dependent upon the geometry, the microfiber diameter and the microfiber length. The electric field is imposed to cause the microfibers to deflect and contact object 113 as shown in FIG. 2D. The circuit may be removed after contact 119 is established, as discussed in greater detail hereinafter, and the bridging microfiber is secured.

Figure 3:
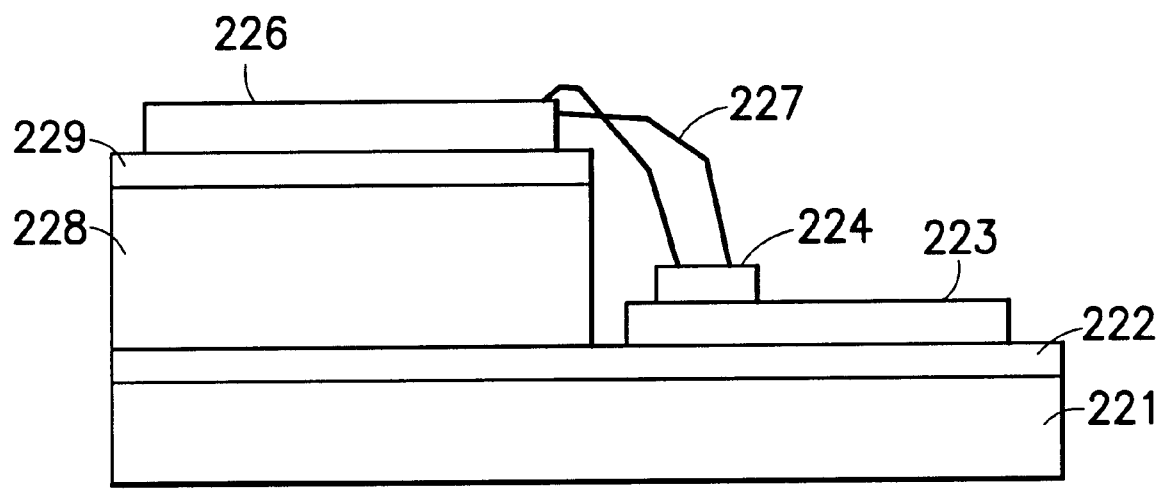
FIG. 3 shows a microelectronic device wherein electrically non-insulating objects in different planes are connected by carbon microfiber connectors.

The electrically non-insulating regions need not lie in the same plane and in fact, the carbon microfiber deflectional bridging technique may be well suited for connecting devices in a three dimensional electronic device, as shown in FIG. 3.

FIG. 3 depicts the use of carbon microfibers 227 to connect electrically non-insulating layers that do not lie in the same plane of the device structure. Object 223 on substrate 221 and optional device layer(s) 222 is connected with carbon microfibers 227 to object 226 located on a second structure 228 having optional device layer(s) 229 thereon.

Figure 4A:
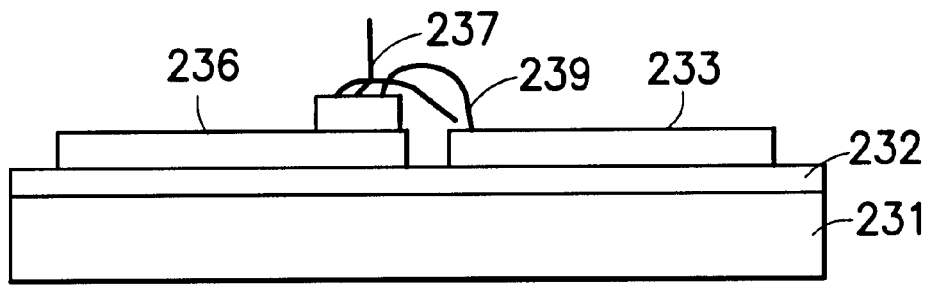
FIGS. 4A–4D show different methods for electrically connecting non-insulating objects on a substrate by carbon microfiber connector.

The carbon microfibers may be attached to a second object in any of a number of ways that will affect how electrical charge is conducted. As shown in FIG. 4A, a carbon microfiber 237 grown on electrically non-insulating object 236 on the substrate 231, having optional device layer(s) 232 thereon, may be attached to electrically non-insulating object 233 at contact point 239 via spot welding. The electric field used to draw the carbon microfiber to object 236 is generated by applying an electrical potential between object 236 and object 233. Upon touching, current will flow. The point of greatest resistance—where the tip of the carbon microfiber contacts the object—will heat upon contact, welding the tip to object 233.

Figure 4B:
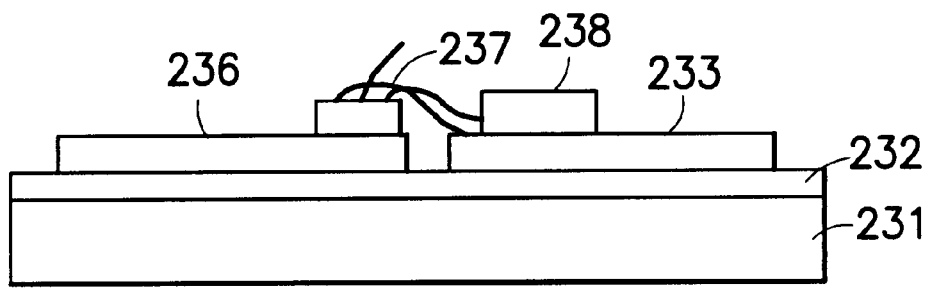
Figure 4C:
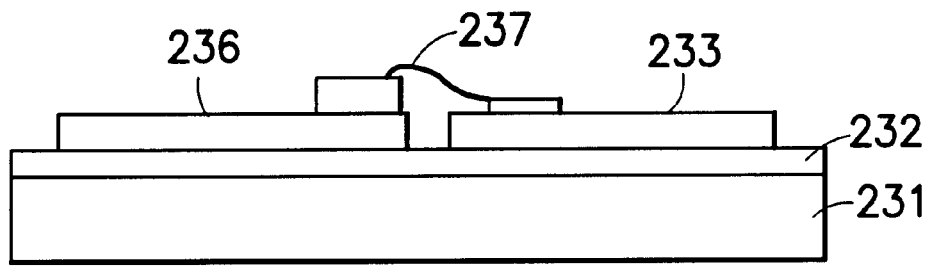
Figure 4D:
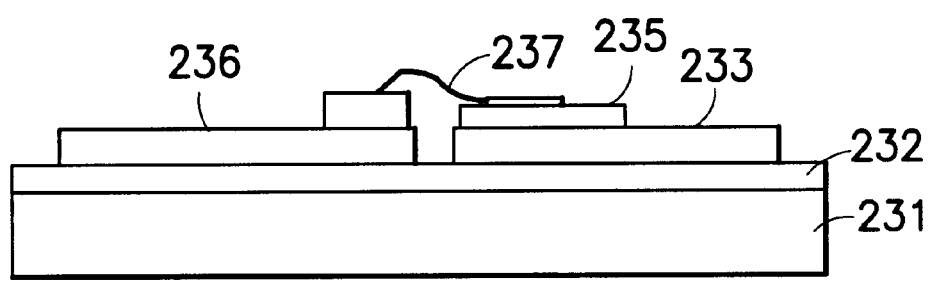

Alternatively, as shown in FIG. 4B, the carbon microfiber 237 may be drawn to object 233 with the electric field, then a metal layer 238 deposited over it using conventional microfabrication techniques. The carbon microfiber 237 may also be held in place by vander Waals forces as shown in FIG. 4C; under this circumstance the contact may be Schottky-like. Furthermore, the surface of object 233 may be coated with a material 235 (FIG. 4D) that produces a chemical reaction with the carbon microfiber causing it to be mechanically bonded to object 233. For such purpose, the carbon microfiber may contain a catalyst for the chemical reaction, e.g., the catalyst metal, in the tip of the carbon microfiber.

As a further alternative, the contact between the respective objects can be formed during the growth process. The growth of carbon nanotubes may be catalyzed by a metal catalyst particle in which the metal particle lies at or near the tip of the nanotube. When the carbon nanotube 237 reaches the other object 233, the tip of the carbon nanotube may fuse into the material of such object 233, losing catalytic activity and terminating further the growth of the carbonnanotube.

Figure 5:
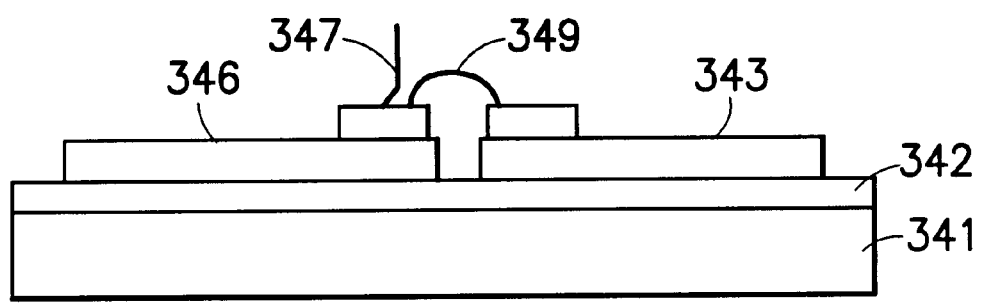
FIG. 5 shows a microelectronic device wherein electrically non-insulating objects on a substrate are connected by a carbon microfiber connector grown from each object to intersect with one another and join in a composite connector structure.

The preceding discussion has related to contacting an electrically conductive object with a carbon microfiber to effect "wiring" of a microelectronic device element, but such wiring may also be accomplished via a spot welding approach in which carbon microfibers are produced from two different electrically conductive objects and joined "midway" via a spot welding technique, as illustrated schematically in FIG. 5.

In FIG. 5, carbon microfibers 347 are grown on objects 343 and 346 disposed on substrate 341 with optional device layer(s) 342, and such carbon microfibers 347 are caused to contact one another intermediate the electrically non-insulating objects 343 and 346, thereby meeting and joining by spot welding.

Figure 6:
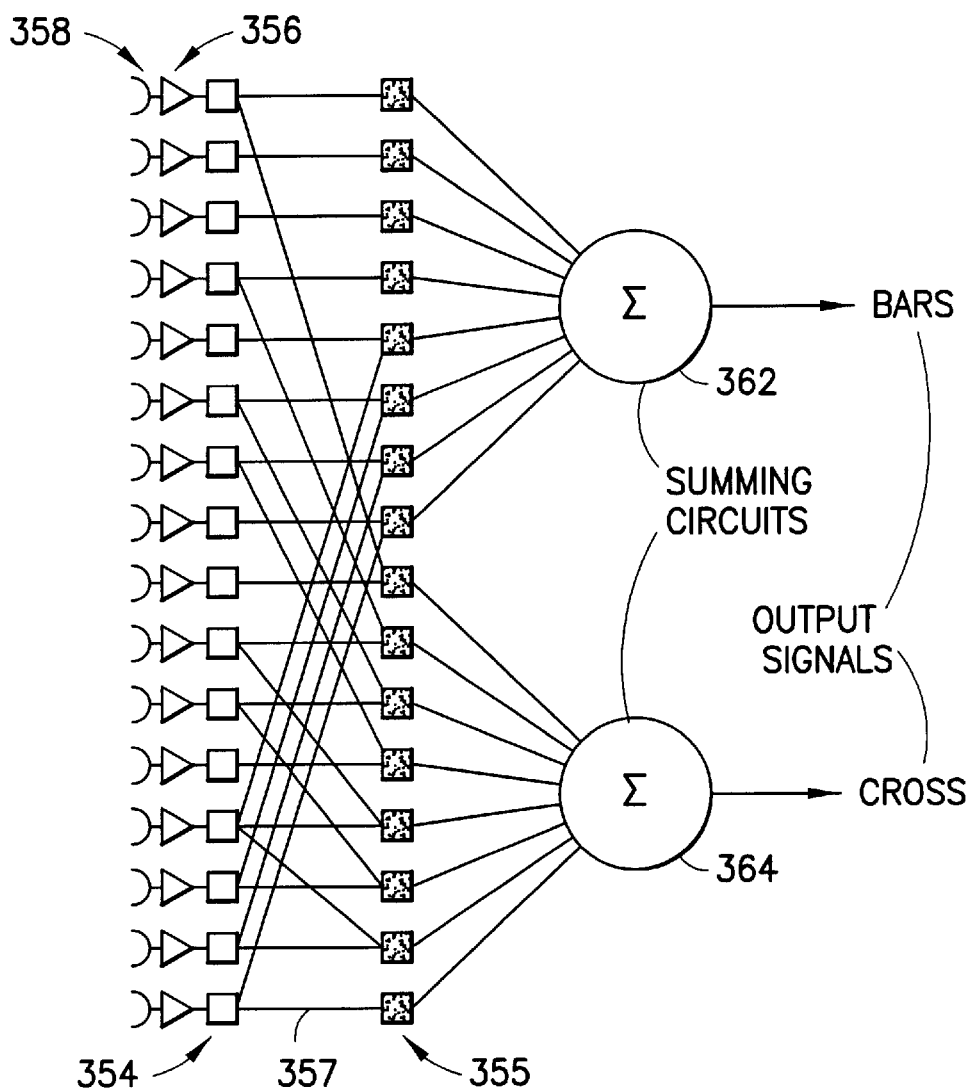
FIG. 6 is a schematic representation of an external stimulus-mediated wiring system for growth of carbon microfiber connectors in a microelectronic or microelectromechanical device structure.
Figure 6A:
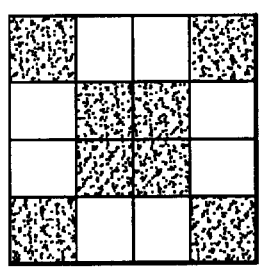
FIG. 6A shows a cross input image for an external stimulus-mediated wiring system for growth of carbon microfiber connectors in a microelectronic or microelectromechanical device structure.
Figure 6B:
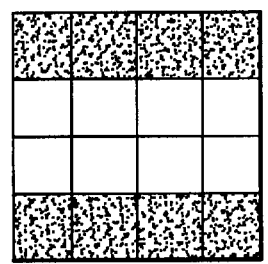
FIG. 6B shows a bars input image for an external stimulus-mediated wiring system for growth of carbon microfiber connectors in a microelectronic or microelectromechanical device structure.

The wiring examples described hereinabove have utilized wiring arrangements in which the potential is established purposefully, but such an approach is not strictly necessary. An alternative approach may be utilized, in which the potential is determined by an external stimuli from, for example, a sensor array and from the desired outcomes associated with the external stimuli, similar to a feed forward neural network. Intermediate stages may also be used to amplify, modulate, add, or smooth the signal. Such a means of wiring may be advantageous in instances in which many connections are required and the optimal connectivity may not be known. FIG. 6 shows this process schematically for the case in which the external stimuli are images that consist of a cross pattern (FIG. 6a) or a bar pattern (FIG. 6B) and the sensor array consists of an array of optical detectors 358 upon which the image is formed.

In FIG. 6, the wiring approach does not utilize predetermined wire patterning. Instead, the circuit is trained by presenting representative images, e.g. cross input image 359 shown in FIG. 6A or the bars input image 360 shown in FIG. 6B. Each optical detector (pixel) 358 provides an input after being amplified or shaped via circuit 356 to one of pads 354 from which carbon microfiber wires 357 are grown. Proper wiring is obtained during training by defining the output from the summation circuit 362 providing a BARS output signal when a bar image is presented, and by defining the output from the summation circuit 364 providing a CROSS output signal when a cross image is presented. By defining the output and providing a given input stimuli, an appropriate electrical potential can be established between certain sensor pads 354 and analysis pads 355. The potential will attract the carbon nanotube, causing the proper connection to be made between sensor structures 354 and analysis circuit pads 355 using carbon nanotubes 357.

Figure 7A:
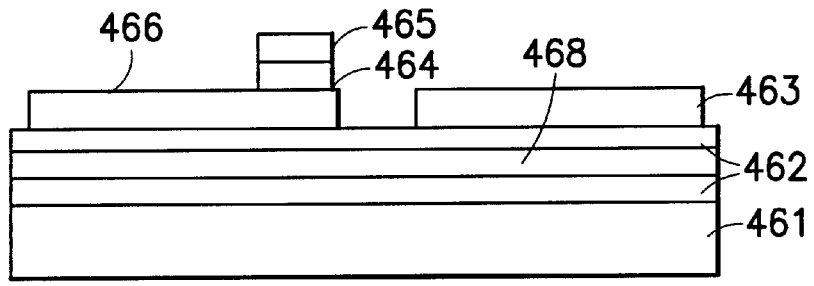
FIGS. 7A–7C depict a process flow for electrically connecting non-insulating objects by a carbon microfiber connector on a substrate including an etch stop layer for an oxide layer.
Figure 7B:
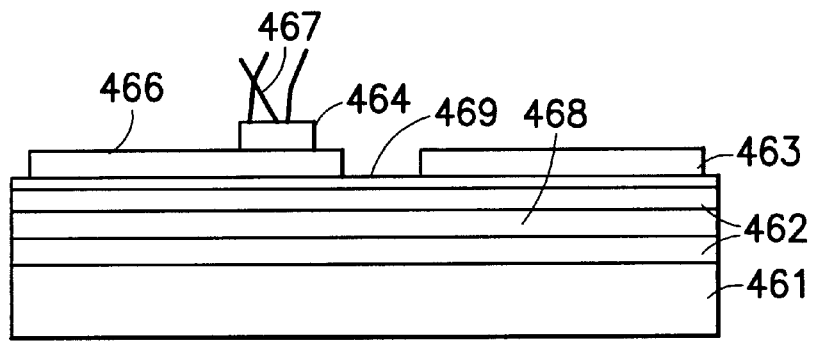
Figure 7C:
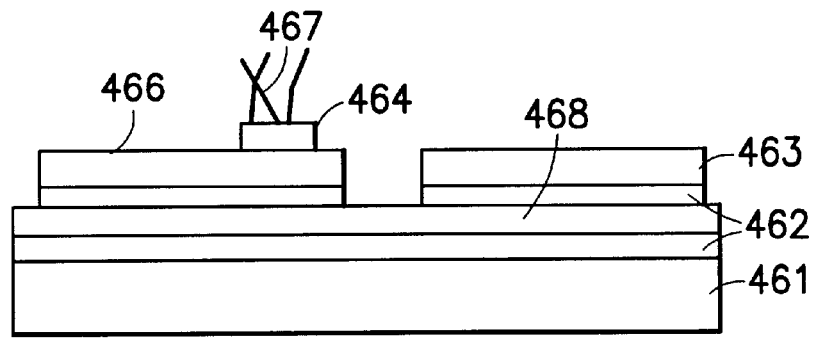

Given the tendency for carbonaceous material to be deposited on insulating layers during growth of carbon microfibers, a sacrificial layer may be produced to facilitate removal of the carbonaceous material from the insulating layer. FIGS. 7A–7C show a process flow for a structure comprising carbon microfiber wires and with a sacrificial layer composed of $SiO_2$.

FIG. 7 shows a process flow for producing a connector structure to enable electrical connection of non-insulating objects 463 and 466 on a substrate 461 having oxide layers 462 thereon with an etch stop layer 468 therebetween, as shown. A catalyst support 464 and catalyst 465 are deposited on object 466 (FIG. 7A). Carbon microfibers 467 are grown concurrently with carbonaceous material 469. In FIG. 7C the top oxide layer 62 is removed along with carbonaceous material.

The sacrificial layer shown in FIG. 7 need not be deposited below the electrically non-insulating layers 463 and 466. Another approach utilizes oxide layer 462 and etch stop layer 468 deposited over 466 and 463 with holes opened in the oxide layer 462 and etch stop layer 468 to deposit the catalyst and to enable carbon microfiber connection to object 463 to occur.

A further alternative approach to reduce the deposition of carbonaceous materials on the insulating layers is to optimize the catalytic carbon nanotube growth chemistry. The growth of carbon nanotubes is catalyzed by transition metal catalysts whereas the deposition of carbonaceous materials is the result of thermal cracking of the carbon source. By selecting a carbon source with minimal tendency of thermal decomposition, growth of carbonnanotubes can be achieved without significant deposition of undesirable carbonaceous material.

Figure 8:
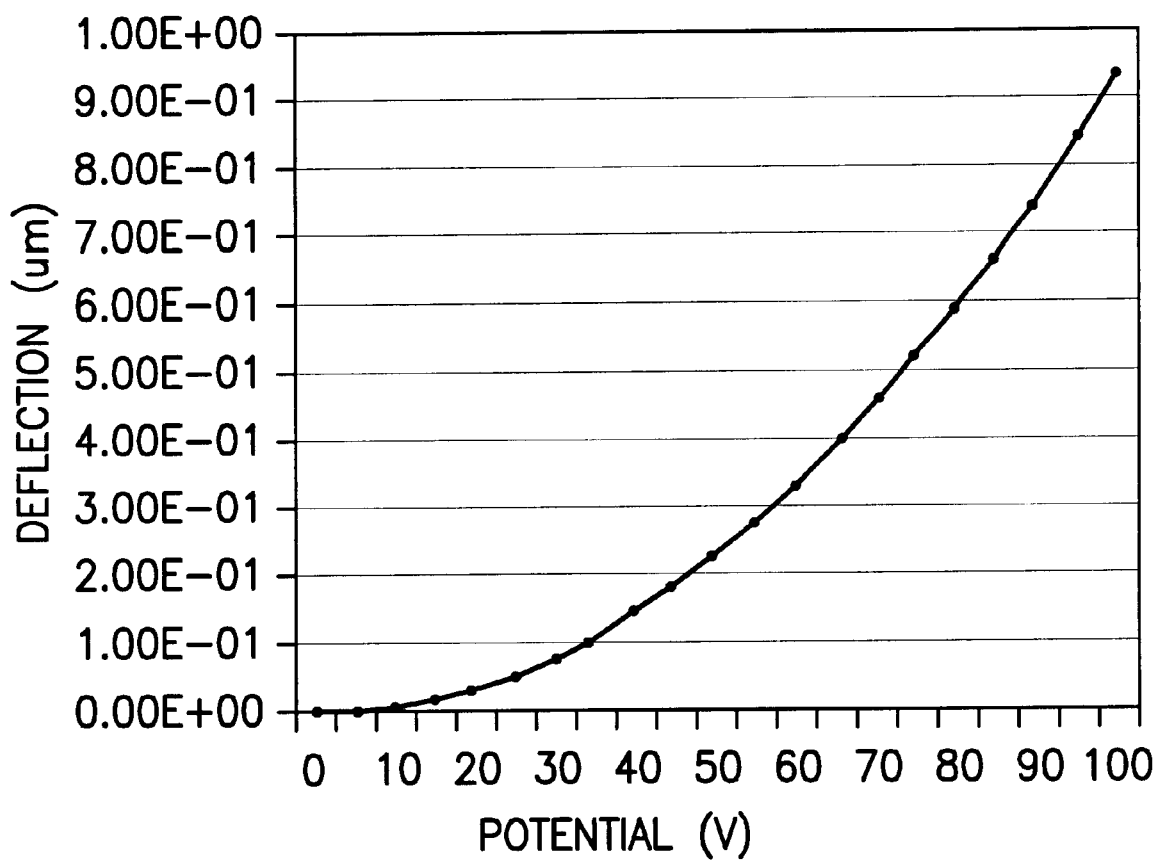
FIG. 8 shows a graph of the calculated deflection of a straight carbon microfiber, in micrometers, as a function of applied field, in volts, for a nanofiber-electrode separation distance of 10 micrometers.

FIG. 8 shows a graph of the calculated deflection of a straight carbon microfiber, in micrometers, as a function of applied field, in volts, for a nanofiber-electrode separation distance of 10 micrometers. From the field estimate it is clear that the fields required to enable deflection may be reasonably obtained on the surface of a wafer.

Component of Electrical Device

A wide variety of devices may be formed using a carbon microfiber (nanotube) as a part of the active device.

A point contact rectifier can be formed from a carbonnanotube produced using a catalytic growth process of the general type described in U.S. Pat. No. 5,872,422. The point contact rectifier, particularly if a small diameter carbon microfiber is used, achieves a very small capacitance, as for example is desirable in microwave device applications. Similarly, one can use the carbonnanotube as a gate element for a MOSFET, with the advantage that the carbonnanotube can be produced with a particular dimensional character through the catalytic patterning process outlined earlier.

There is an increasing body of evidence that carbon nanotubes, if free of defects, possess a small bandgap and can be readily doped. A variety of electronic devices can be fabricated to capitalize on the semiconducting properties of carbon nanotubes, using a catalytic growth process.

FIG. 9 shows schematically representative semiconducting devices.

Figure 9A:
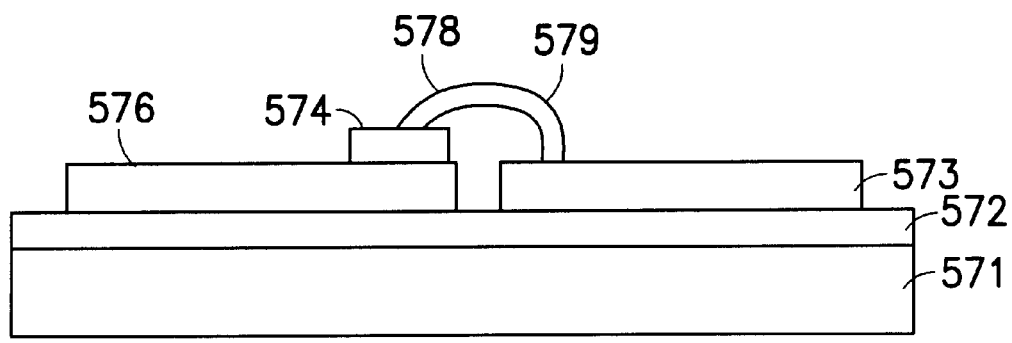
FIG. 9A shows a microelectronic device including a pn junction formed on a substrate using doped carbon microfibers, according to a first illustrative embodiment.

In FIG. 9A, a semiconducting diode is formed along the length of the nanotube by varying the type and concentration of a dopant species in the gas stream during growth. For example, fabrication of the diode might proceed by forming a patterned substrate comprising non-insulating region 576 and 573 and the patterned catalyst on diffusional barrier 574, over substrate 571 and optional device layer(s) 572, using conventional microelectronic device fabrication techniques.

The substrate next is heated to growth temperature and a hydrocarbon source and a first dopant source are introduced into the chamber. The carbon nanotube is grown, producing a doped tube region 578 of a first conductivity type. Part way through the growth, the first impurity source is turned off and a second impurity source is introduced into the growth chamber. The tube continues to grow, producing a second conductivity type region 579. Dopant gases might include diborane, phosphine, trimethylamine (TMA), triethylamine (TEA), nitrogen, etc. The doped regions 578 and 579 may be n-type, p-type, or alternatively such regions may be undoped. Additional doped tube regions may be formed to produce more complicated structures e.g. a p-i-n structure may also be produced. The connection of the doped tube to object 573 may be achieved by use of the techniques discussed earlier.

Alternatively, tubes of first one conductivity type and then of a second conductivity type may be grown using alternating patterning, masking and growth steps to produce carbon nanotubes of different conductivty types attached to different non-insulating regions. The tubes of different conductivity type may be made to contact one another, as shown in FIG. 9B and using the techniques discussed earlier, to produce a junction device.

Figure 9B:
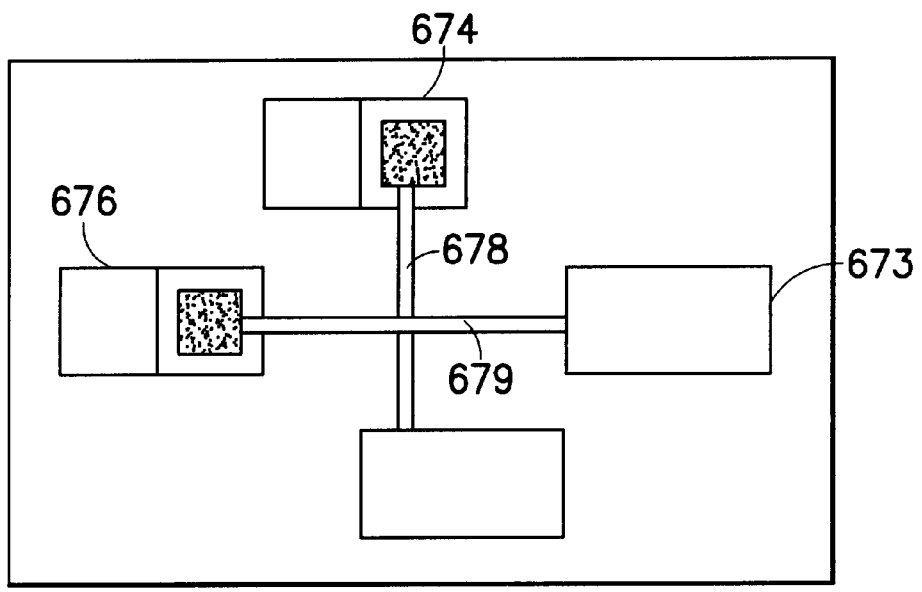
FIG. 9B shows a microelectronic device including a pn junction formed on a substrate using doped carbon microfibers, according to a second illustrative embodiment.

In FIG. 9B, a pn junction device is shown as having been formed from doped carbon nanotubes. Electrically non-insulating layers 673 and 676 are formed on substrate 671 and device layer(s) 672. A catalyst support 674 and catalyst are deposited in select regions using microelectronic device fabrication techniques. Carbon nanotubes of differing conductivity are grown by varying the carbon nanotube growth conditions to produce tubes or tube regions of differing conductivity types, 678 and 679. The tubes of different conductivity type are made to cross and the device junction is formed where they are in contact.

Figure 10:
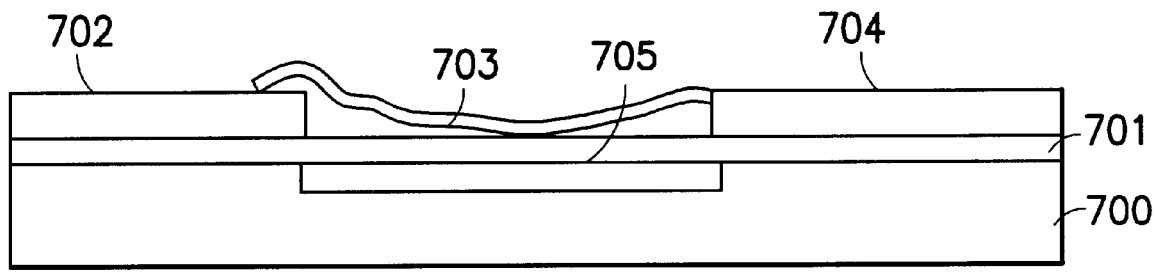
FIG. 10 is a schematic representation of a carbon microfiber field effect transistor according to one embodiment of the invention.

FIG. 10 shows another example of an electronic device based on semiconducting properties of the carbon nanotubes. In the microelectronic device structure shown in FIG. 10, gate electrode 705 is formed on the substrate 700. A thin insulator 701 is deposited on the substrate 700 and gate electrode 705, and source 702 and drain 704 regions are formed. Carbon nanotube 703 is connected between the source and drain electrodes using the techniques described previously. The conductivity of the carbon nanotube 703 can be modulated by applying a potential on the gate 705, thus the current flow between the source 702 and drain 704 can be modulated by the gate, thereby forming a carbon nanotube field effect transistor.

Component of a MEMS Device

Figure 11:
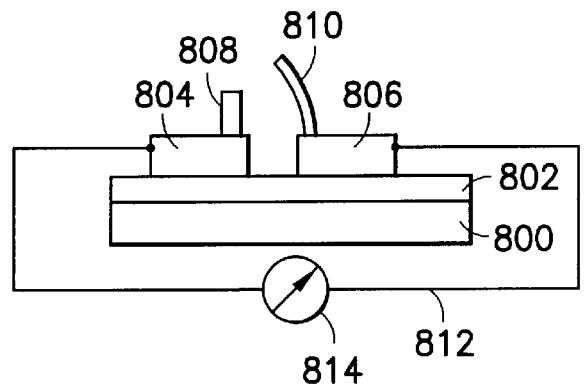
FIG. 11 is a schematic representation of a microelectromechanical structure for an accelerometer or flow sensor device, comprising a carbon microfiber element.
Figure 12:
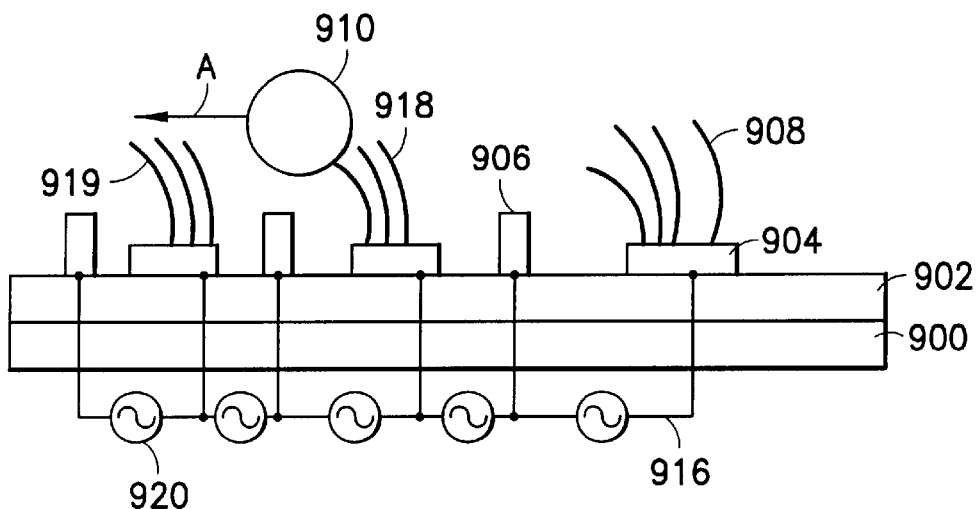
FIG. 12 is a schematic representation of a cilliated microelectromechanical structure, comprising a carbon microfiber element.
Figure 13:
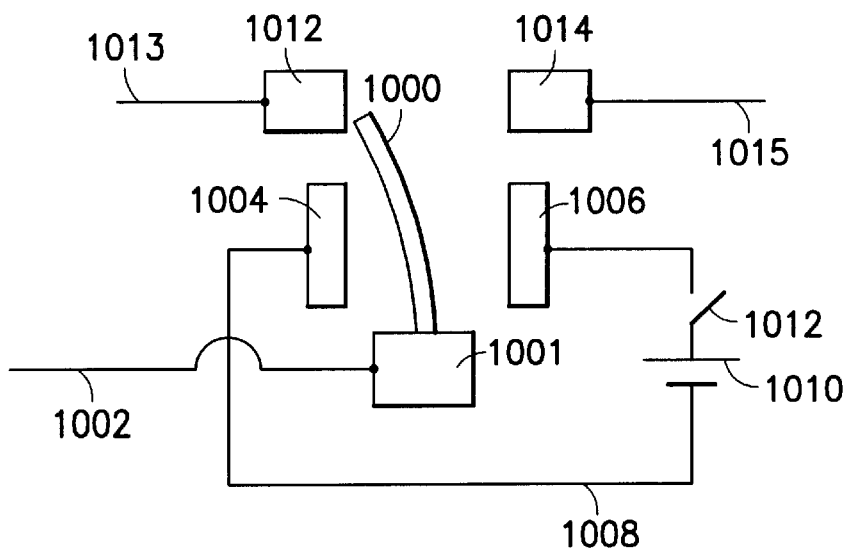
FIG. 13 is a schematic representation of a microelectromechanical structure for a relay device comprising a carbon microfiber element.

The unique mechanical and electrical properties of carbon nanotubes enable a variety of novel electromechanical devices to be produced, when a suitable method of incorporating the carbon nanotube (microfiber) into the device is employed. The catalyst patterning and carbon nanotube growth process of U.S. Pat. No. 5,872,422 provides a useful approach for accomplishing this result. FIGS. 11, 12 and 13 show various illustrative microelectromechanical devices produced using carbon nanotubes.

FIG. 11 shows a MEMS device that may be utilized as an accelerometer or alternatively as a flow sensor. The device includes a substrate 800 with optional device layer(s) 802 thereon overlying which are non-insulative objects 804 and 806. Object 804 has an upstanding contact element 808 thereon. In corresponding fashion, a carbon microfiber 810 is associated with the object 806. The non-insulative objects 804 and 806 are interconnected by a circuit including wire 812 having a metering device 814, e.g. a voltage monitor, for sensing the voltage differential on the objects 804 and 806.

In use of the FIG. 11 device as an accelerometer, the acceleration or deceleration of an associated mass or body will cause the carbon microtube to deflect into contact with the contact 808, thereby closing the circuit and changing the voltage that is sensed by the monitor 814. The sensed voltage change then may be used to initiate some correlative action (e.g., actuate a microdetonator to ignite and inflate an airbag) in relation to the sensed acceleration or deceleration.

In use of the FIG. 11 device as a flow sensor, the velocity of the flow stream being monitored can be sensed to close the circuit and indicate a flow velocity exceeding a predetermined value, for the taking of corrective or remedial action.

Alternatively the metering device 814 may measure the capacitance between element 808 and carbon microfiber 810, providing a graded signal related to the separation between element 808 and carbon microfiber 810. This signal can be correlated with the amount of fiber deflection and hence the acceleration or flow.

FIG. 12 is a schematic representation of a ciliated motive driver including a substrate 900 having device layer(s) 902. On the substrate is formed non-insulative objects 904 and 906. Object 906 is an upstanding attraction element. A carbon microfiber 908 is associated with the object 904. In like manner, an array of carbon microfibers 918 and 919 is associated with corresponding objects, and the potential between the attraction element 906 may be selectively varied by circuitry comprising voltage sources 920 and line 916. A sensor element 910 is provided, which is of light weight, and which is motivated to move in the direction indicated by arrow A in FIG. 12. Such movement of the sensor element 910 is effected by the time-sequenced imposition of a deflection voltage on each of the carbon microfiber arrays (the first array on the right-hand side of the FIG. 12, followed by removal of such voltage and appropriately timed imposition of same on the next-left array 918 of carbon microfibers, followed by removal of such voltage and appropriately timed imposition of same on the next-succeeding array 919 of carbon microfibers.

In this fashion, each of the respective arrays of carbon microfibers constitute a motive driver for the sensor/indicator element 910, so that the leftward deflection of the sensor element 910 causes such element to be translated from one locus to another, as a microactuator device.

FIG. 13 is a schematic view of a microelectromechanical device that may be used as a relay device. In this microelectromechanical device, a circuit 1008 has a power supply 1010 disposed therein, together with a switch 1012 for selective actuation of the device. The circuit 1008 terminates in a pair of oppositely facing electrodes 1004 and 1006, between which is a carbon microfiber element 1000 mounted on a base structure 1001 receiving an input voltage in line 1002.

The magnitude of the input voltage in line 1002 in relation to the magnitude of the voltage (potential) difference between electrodes 1004 and 1006 determines the direction and extent of the deflection of the carbon microfiber element 1000. If the carbon microfiber element 1000 deflects to the left and touches contact 1012, an output signal is generated and transmitted in line 1013 to a signal processing unit (not shown) for taking of corresponding or associated action. In like manner, if the carbon microfiber element 1000 deflects to the right and touches contact 1014, an output signal is generated and transmitted in line 1015 to a signal processing unit (not shown) for taking of corresponding or associated action.

It will therefore be apparent from the foregoing that the carbon microfibers of the present invention may be variously employed as deflection or actuator elements as a result of their conductive character and their translational capability, in a wide variety of microelectromechanical device structures.

Further, although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

1. A microelectronic or microelectromechanical device, comprising:
   a substrate, wherein the substrate includes an oxide layer and an etch stop layer for the oxide layer; and
   a fiber formed of a carbon-containing material.

2. The microelectronic and/or microelectromechanical device of claim 1, wherein the fiber electrically interconnects at least two non-insulative regions on the substrate.

3. The microelectronic and/or microelectromechanical device of claim 1, wherein the substrate surface comprises at least one transition metal or compound or alloy thereof.

4. The microelectronic and/or microelectromechanical device of claim 1, wherein the fiber is grown catalytically in situ on a surface of the substrate from a carbon-containing precursor material.

5. The microelectronic and/or microelectromechanical device of claim 1, wherein the substrate comprises at least one material selected from the group consisting of ceramics, glasses, semiconductors, metals and alloys.

6. The microelectronic and/or microelectromechanical device of claim 1, wherein the fiber has an average diameter less than 10 microns.

7. The microelectronic and/or microelectromechanical device of claim 1, wherein the fiber has an average length to width ratio greater than about 2.

8. The microelectronic and/or microelectromechanical device of claim 1, wherein the fiber comprises a catalyst material comprising at least one transition metal compound.

9. The microelectronic and/or microelectromechanical device of claim 1, wherein the fiber comprises a catalyst material comprising at least one transition metal selected from the group consisting of Fe, Co, Ni, Mn, Cr, Mo, W, Re, Ru, Os, Rh, Ir, Pd, Pt, Cu and Zn.

10. The microelectronic and/or microelectromechanical device of claim 1, wherein the substrate surface comprises a metal film.

11. The microelectronic and/or microelectromechanical device of claim 10, wherein the at least one transition metal is selected from the group consisting of Fe, Co, Ni, Mn, Cr, Mo, W, Re, Ru, Os, Rh, Ir, Pd, Pt, Cu and Zn.

12. The microelectronic and/or microelectromechanical device of claim 1, wherein the substrate surface comprises a semiconductor or dielectric material.

13. The microelectronic and/or microelectromechanical device of claim 1, comprising a microelectronic device including a pn junction, wherein said carbon-containing fiber is doped to form the pn junction.

14. The microelectronic and/or microelectromechanical device of claim 1, in which the carbon containing fiber is used to make an ohmic electrical contact.

15. The microelectronic and/or microelectromechanical device of claim 1, in which the carbon containing fiber is used to make a non-ohmic electrical contact.

16. The microelectronic and/or microelectromechanical device of claim 1, in which the carbon containing fiber has defects or impurities added to alter electrical conductivity.

17. The microelectronic and/or microelectromechanical device of claim 1, comprising a microelectronic device including a field effect transistor.

18. The microelectronic and/or microelectromechanical device of claim 1, comprising a carbon-containing fiber connecting two electrodes and a third electrode for modulating the conductivity of the carbon containing fiber.

19. A method of forming a carbon-containing fiber on a substrate, as a component of a microelectronic or microelectromechanical device, comprising the steps of:
  growing at least one carbon-containing fiber catalytically on a surface of the substrate by heating the substrate in the presence of a carbon source to a temperature sufficient to grow the fiber on the substrate surface, wherein the carbon-containing fiber is intersectingly grown from two different regions of the substrate, whereby intersection of respective growths forms the carbon-containing fiber.

20. The method of claim 19, wherein the carbon-containing fiber electrically connects two or more non-insulative regions on the substrate.

21. The method of claim 19, wherein the carbon-containing fiber is intersectingly grown from two different regions of the substrate, whereby intersection of respective growths forms the carbon-containing fiber.

22. The method of claim 19, wherein the fiber is grown-catalytically in situ on a surface of the substrate from a carbon-containing precursor material.

23. The method of claim 19, wherein the substrate comprises at least one material selected from the group consisting of ceramics, glasses, semiconductors, metals and alloys.

24. The method of claim 19, wherein the fiber has an average diameter less than 10 microns.

25. The method of claim 19, wherein the fiber has an average length to width ratio greater than about 2.

26. The method of claim 19, wherein the fiber comprises a catalyst material comprising at least one transition metal compound.

27. The method of claim 19, further comprising connecting the fiber to a surface or element of the device.

28. The method of claim 27, wherein the connecting is conducted after growth of the fiber.

29. The method of claim 27, wherein the connecting is conducted during growth of the fiber.

30. The method of claim 19, wherein the fiber comprises a catalyst material comprising at least one transition metal selected from the group consisting of Fe, Co, Ni, Mn, Cr, Mo, W, Re, Ru, Os, Rh, Ir, Pd, Pt, Cu and Zn.

31. The method of claim 19, wherein the substrate surface comprises a metal film.

32. The method of claim 19, wherein the substrate surface comprises at least one transition metal or compound or alloy thereof.

33. The method of claim 32, wherein the at least one transition metal is selected from the group consisting of Fe, Co, Ni, Mn, Cr, Mo, W, Re, Ru, Os, Rh, Ir, Pd, Pt, Cu and Zn.

34. The method of claim 19, wherein the substrate surface comprises a semiconductor or dielectric material.

35. The method of claim 19, wherein the substrate includes an oxide layer and an etch stop layer for the oxide layer.

36. The method of claim 19, wherein said device comprises a microelectronic device including a pn junction, wherein said carbon-containing fiber is doped to form the pn junction.

37. The method of claim 19, wherein the carbon containing fiber is used to make an ohmic electrical contact.

38. The method of claim 19, wherein the carbon containing fiber is used to make a nonohmic electrical contact.

39. The method of claim 19, wherein an electrical junction is formed between two carbon-containing fibers.

40. The method of claim 19, wherein the carbon containing fiber has defects or impurities added to alter electrical conductivity.

41. The method of claim 19, wherein the dopant impurities comprise H, B, Al, N, P, Li, Be, Na, or K.

42. The method of claim 19, wherein carbon microfiber dopant impurities are introduced after carbon microfiber growth.

43. The method of claim 19, wherein said device comprises a microelectronic device including a field effect transistor.

44. The method of claim 19, wherein the heating is carried out at a temperature from about 350° C. to about 1200° C. in a carbon-containing gas.

45. The method of claim 44, wherein the carbon-containing gas is selected from the group consisting of hydrocarbons, carbon-containing compounds and carbon monoxide.

46. The method of claim 19, comprising the use of a catalyst for growth of the carbon-containing fiber.

47. The method of claim 46, wherein the catalyst is in a particulate form.

48. The method of claim 47, wherein the catalyst comprises catalyst particles having an average diameter less than about 200 nanometers.

49. The method of claim 46, wherein the catalyst is in the form of a catalyst film.

50. The method of claim 49, wherein the catalyst film has a thickness of less than about 1 micrometer.

51. The method of claim 46, wherein the catalyst is patterned on the substrate.

52. A method of forming a carbon-containing fiber on a substrate, wherein the carbon-containing fiber is a component of a microelectronic or microelectromechanical device, comprising the step of:
  growing at least one carbon-containing fiber catalytically on a surface of the substrate by heating the substrate in the presence of a carbon source to a temperature sufficient to grow the fiber on the substrate surface, wherein the substrate includes an oxide layer and an etch stop layer for the oxide layer.

53. A method of forming a carbon-containing fiber on a substrate, wherein the carbon-containing fiber is a component of a microelectronic or microelectromechanical device, comprising the step of:
  growing at least one carbon-containing fiber catalytically on a surface of the substrate by heating the substrate in the presence of a carbon source to a temperature sufficient to grow the fiber on the substrate surface, wherein the substrate includes an oxide layer and an etch stop layer for the oxide layer.

54. A method of forming a carbon-containing fiber on a substrate, wherein the carbon-containing fiber is a component of a microelectronic or microelectromechanical device, comprising the step of:

growing at least one carbon-containing fiber catalytically on a surface of the substrate by heating the substrate in the presence of a carbon source to a temperature sufficient to grow the fiber on the substrate surface, wherein the carbon-containing fiber is intersectingly grown from two different regions of the substrate, whereby intersection of respective growths forms the carbon-containing fiber.

55. A method of forming microelectronic or microelectromechanical device components that comprise carbon-containing fibers, comprising the step of:

growing at least one carbon-containing fiber catalytically on a surface by heating the surface in the presence of a carbon source to a temperature sufficient to grow the fiber on the surface, wherein impurities are introduced during carbon microfiber growth.

\* \* \* \* \*